United States Patent
Chien et al.

(10) Patent No.: US 10,661,357 B2
(45) Date of Patent: May 26, 2020

(54) DRILL STRUCTURE

(71) Applicant: TCT GLOBAL LIMITED, Tsuen Wan, New Territories (HK)

(72) Inventors: Sung Hao Chien, Taoyuan Hsien (TW); Li Yi Chao, Taoyuan Hsien (TW); Feng Yu Lin, Taoyuan Hsien (TW); Cheng Chia Lee, Taoyuan Hsien (TW); Ming Yuan Zhao, Taoyuan Hsien (TW); Chun Yu Chen, Taoyuan Hsien (TW)

(73) Assignee: TCT GLOBAL LIMITED, Tsuen Wan, New Territories (HK)

( * ) Notice: Subject to any disclaimer, the term of this patent is extended or adjusted under 35 U.S.C. 154(b) by 0 days.

(21) Appl. No.: 16/126,464

(22) Filed: Sep. 10, 2018

(65) Prior Publication Data

US 2019/0240744 A1    Aug. 8, 2019

(30) Foreign Application Priority Data

Feb. 2, 2018   (TW) .............................. 107103732 A

(51) Int. Cl.
  *B23B 51/02*   (2006.01)
  *H05K 3/00*   (2006.01)

(52) U.S. Cl.
  CPC .......... *B23B 51/02* (2013.01); *H05K 3/0047* (2013.01); *B23B 2251/04* (2013.01); *B23B 2251/14* (2013.01); *B23B 2251/18* (2013.01); *B23B 2251/408* (2013.01); *B23B 2251/426* (2013.01);

(Continued)

(58) Field of Classification Search
  CPC . B23B 51/02; B23B 2251/14; B23B 2251/18; B23B 2251/201; H05K 3/0047; Y10T 408/89; Y10T 408/9097
  See application file for complete search history.

(56) References Cited

U.S. PATENT DOCUMENTS 5,174,691 A * 12/1992 Shepley .................. B23B 51/02
                                                       408/1 R
5,947,659 A *  9/1999 Mays ...................... B23B 51/02
                                                       408/211

(Continued)

FOREIGN PATENT DOCUMENTS

JP        58149114 A  *  9/1983  ............. B23B 51/02
JP      2010125574 A  *  6/2010
JP      2013208692 A  * 10/2013

*Primary Examiner* — Eric A. Gates
(74) *Attorney, Agent, or Firm* — Muncy, Geissler, Olds & Lowe, P.C.

(57) ABSTRACT

A drill structure comprises a shank part and a bit part. A web is formed on the front end of the bit part. Two sides of the web are tilted backward to form two cutting faces. At least one chip-discharge groove is formed on the surface of the bit part. Each cutting face includes a primary cutting face and a secondary cutting face. The thickness of the prismatic web edge of at least one primary cutting face is smaller than the outer-side width of the primary cutting face. An auxiliary cutting face is extended to the wall of the flute from the cutting edge of the primary cutting face and a portion of a blade back of the secondary cutting face of another cutting face. The present invention decreases the drilling resistance during drilling a hole and increases the service life of the drill bit.

5 Claims, 6 Drawing Sheets

(52) U.S. Cl.
CPC ........ *Y10T 408/89* (2015.01); *Y10T 408/9097* (2015.01)

(56) References Cited

U.S. PATENT DOCUMENTS

| | | | |
|---|---|---|---|
| 7,354,229 B2* | 4/2008 | Wakui | B23B 51/02 |
| | | | 408/227 |
| 8,740,512 B2* | 6/2014 | Bomireddy | B23B 51/02 |
| | | | 408/230 |
| 9,468,981 B2* | 10/2016 | Qu | B23B 51/02 |

* cited by examiner

DRILL STRUCTURE

BACKGROUND OF THE INVENTION

1. Field of the Invention

The present invention relates to a drill structure, particularly to a drill structure, whose web has a smaller thickness for decreasing the drilling resistance during drilling a hole.

2. Description of the Prior Art

With advance of science and technology, the circuits on a printed circuit board (PCB) are growing miniaturized to achieve high density and high precision. Confronting the highly competitive environment demanding high quality, high productivity and fast supply, the manufacturers require the micro drills used in PCB to have higher and higher precision, strength, feed rate, and surface finish. In practical fabrication, the manufacturer is likely to stack a plurality of PCB's and drill them simultaneously so as to increase the fabrication efficiency and decrease the fabrication cost. In such a case, the micro drill needs to have longer length and sufficient chip discharge capability.

A micro drill involves a shank part and a bit part connected with the shank part. The front end of the bit part has a cutting face structure 10, as shown in FIG. 1. The cutting face structure 10 includes two primary cutting faces 12 and 12' and two secondary cutting faces 14 and 14', which are symmetrically arranged with respect to a static tip point 16 and used to cut workpieces. The width $W_c$ of the central regions of the primary cutting faces 12 and 12' is equal to the width $W_o$ of the outer regions of the primary cutting faces 12 and 12'. The web 18 has a larger thickness, which causes the micro drill to experience a greater resistant force during drilling and shortens the service life of the primary axis of the micro drill. Besides, the design of the cutting structure 10, which only includes two primary cutting faces 12 and 12' and two secondary cutting faces 14 and 14', is likely to cause the cutting faces to break during drilling.

SUMMARY OF THE INVENTION

One objective of the present invention is to provide a drill structure, wherein the width of the prismatic web edges of the primary cutting faces is smaller than the outer-side width of the primary cutting faces, whereby the web has a smaller thickness, and whereby is decreased the drilling resistance during drilling a hole and increased the life of the bit part, and whereby is solved the abovementioned problems.

Another objective of the present invention is to provide a drill structure, which uses a design of four cutting faces and at least one auxiliary cutting face to significantly enhance the abrasion resistance of the cutting faces and increase the service life of the drill structure.

In order to achieve the abovementioned objectives, one embodiment of the present invention proposes a drill structure, which comprises a shank part and a bit part disposed on one end of the shank part. The bit part has a bit core, which is a cylindrical body along a central axis of the bit part. The bit part has a web at one end of the bit part, which is away from the shank part. Two sides of the web are tilted toward the shank part to form a first cutting face and a second cutting face. A first outer face of the first cutting face and a second outer face of the second cutting face are respectively extended helically around the surface of the bit part and along the bit core toward the shank part to form a first flute and a second flute. The first cutting face includes a first primary cutting face and a first secondary cutting face. The first primary cutting face has a first cutting edge, a first prismatic web edge, a first connection edge, and a first outer edge. The shortest distance between two ends of the first outer edge is defined as an outer-side width of the first primary cutting face. The first connection edge is connected with the first secondary cutting face. The first secondary cutting face includes a first blade back. The second cutting face includes a second primary cutting face and a second secondary cutting face. The second primary cutting face has a second cutting edge, a second prismatic web edge, a second connection edge, and a second outer edge. The shortest distance between two ends of the second outer edge is defined as an outer-side width of the second primary cutting face. The second connection edge is connected with the second secondary cutting face. The second secondary cutting face includes a second blade back. The first prismatic web edge and the second prismatic web edge jointly form the web. The first prismatic web edge is connected with the second secondary cutting face. The second prismatic web edge is connected with the first secondary cutting face. The first cutting edge of the first primary cutting face is not parallel with the first connection edge. The width of the first prismatic web edge is smaller than the outer-side width of the first primary cutting face. A first auxiliary cutting face is extended to a wall of the first chip-discharge groove from the first cutting edge and a portion of the second blade back of the second secondary cutting face, which is near the first prismatic web edge. The second cutting edge of the second primary cutting face is not parallel with the second connection edge. The width of the second prismatic web edge is smaller than the outer-side width of the second primary cutting face. A second auxiliary cutting face is extended to a wall of the second flute from the second cutting edge and a portion of the first blade back of the first secondary cutting face, which is near the second prismatic web edge.

In one embodiment, the web includes a tip; the tip is an intersection point of the first connection edge, the second connection edge, the first prismatic web edge, and the second prismatic web edge; each of the first auxiliary cutting face and the second auxiliary cutting face is in form of a groove and tilted to a direction heading for the tip. In another embodiment, each of the first auxiliary cutting face and the second auxiliary cutting face is in form of a groove and tilted to a direction away from the tip.

In one embodiment, each of the first blade back and the second blade back is in form of double arcs; the first blade back includes a first inner arc and a first outer arc, which are connected with each other; the first inner arc is connected with one end of the second prismatic web edge, which is away from the tip; the second blade back includes a second inner arc and a second outer arc, which are connected with each other; the second inner arc is connected with one end of the first prismatic web edge, which is away from the tip; the first auxiliary cutting face is extended from the first cutting edge and the second inner arc to the wall of the first flute; the second auxiliary cutting face is extended from the second cutting edge and the first inner arc to the wall of the second flute.

In one embodiment, the radius of the cross section of the bit core is defined as the web thickness; each of the outer-side width of the first primary cutting face and the outer-side width of the second primary cutting face is larger than the web thickness. In one embodiment, the first primary cutting face is gradually widened from the first prismatic web edge toward the first outer edge; the second primary cutting face is gradually widened from the second prismatic web edge toward the second outer edge.

Another embodiment of the present invention proposes a drill structure, which comprises a shank part and a bit part disposed on one end of the shank part. The bit part has a bit core, which is a cylindrical body along a central axis of the bit part. The bit part has a web at one end of the bit part, which is away from the shank part. Two sides of the web are tilted toward the shank part to form a first cutting face and a second cutting face. A first outer face of the first cutting face is extended helically around the surface of the bit part and along the bit core toward the shank part to form a first flute. The first cutting face includes a first primary cutting face and a first secondary cutting face. The first primary cutting face has a first cutting edge, a first prismatic web edge, a first connection edge, and a first outer edge. The shortest distance between two ends of the first outer edge is defined as an outer-side width of the first primary cutting face. The first connection edge is connected with the first secondary cutting face. The first secondary cutting face includes a first blade back. The second cutting face includes a second primary cutting face and a second secondary cutting face. The second primary cutting face is in form of a triangle. The second primary cutting face has a second prismatic web edge, a second connection edge, and a second outer edge. The second connection edge is connected with the second secondary cutting face. The second secondary cutting face includes a second blade back, a third outer edge, and a fourth outer edge. The first prismatic web edge and the second prismatic web edge jointly form the web. The first prismatic web edge is connected with the second secondary cutting face. The second prismatic web edge is connected with the first secondary cutting face. The first cutting edge of the first primary cutting face is not parallel with the first connection edge. The width of the first prismatic web edge is smaller than the outer-side width of the first primary cutting face. A first auxiliary cutting face is extended to a wall of the first chip-discharge groove from the first cutting edge and a portion of the second blade back of the second secondary cutting face, which is near the first prismatic web edge.

In one embodiment, the web includes a tip; the tip is an intersection point of the first connection edge, the second connection edge, the first prismatic web edge, and the second prismatic web edge; the first auxiliary cutting face is in form of a groove and tilted to a direction heading for the tip. In another embodiment, the first auxiliary cutting face is in form of a groove and tilted to a direction away from the tip. In one embodiment, the first primary cutting face is gradually widened from the first prismatic web edge toward the first outer edge.

In one embodiment, the second blade back is in form of double arcs; the second blade back includes a second inner arc and a second outer arc, which are connected with each other; the second inner arc is connected with one end of the first prismatic web edge, which is away from the tip; the first auxiliary cutting face is extended from the first cutting edge and the second inner arc to the wall of the first flute; the second inner arc of the second secondary cutting face is smooth connected with the first cutting edge.

DESCRIPTION OF THE PREFERRED EMBODIMENTS

The present invention is described in detail with embodiments below. However, these embodiments are only to exemplify the present invention but not intended to limit the scope of the present invention.

Figure 1:
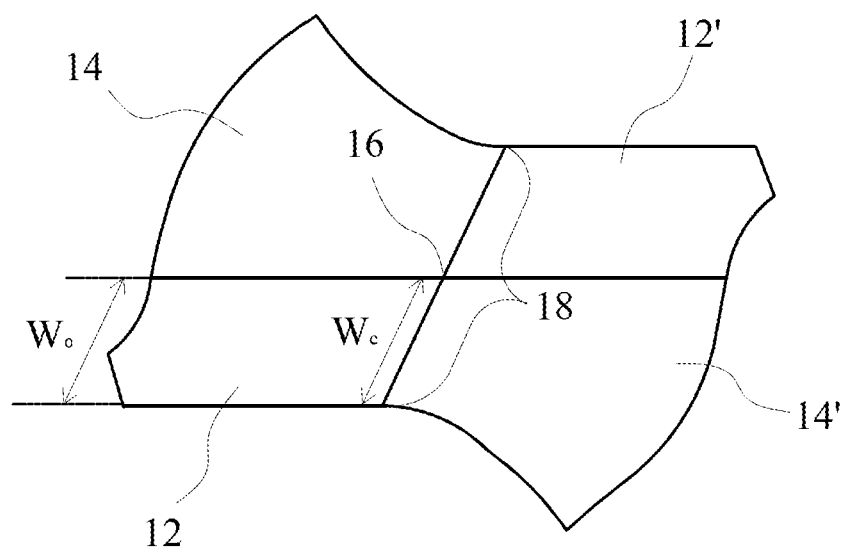
FIG. 1 is a diagram schematically showing the cutting faces of a conventional drill structure.
Figure 2:
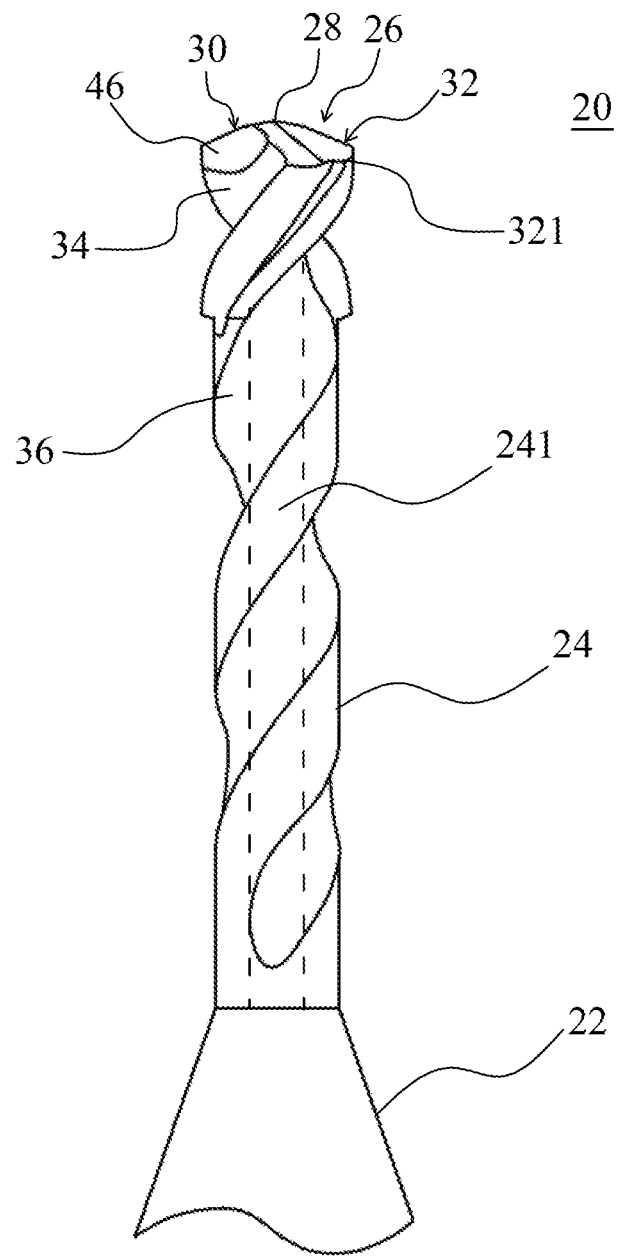
FIG. 2 is a diagram schematically showing a drill structure according to one embodiment of the present invention.

FIG. 2 is a diagram schematically showing a drill structure according to one embodiment of the present invention. As shown in FIG. 2, the drill structure 20 comprises a shank part 22 and a bit part 24 disposed at one end of the shank part 22. The bit part 24 has a bit core 241 (drawn with dashed lines), which is a cylindrical body along the central axis of the bit part 24. The front region of the bit part 24 has a cutting face structure 26. The cutting face structure 26 has a web 28 at the frontmost point of the bit part 24, which is away from the shank part 22. Two sides of the web 28 are tilted toward the shank part 22 to form a first cutting face 20 and a second cutting face 32. A first outer face (not shown in the drawing) of the first cutting face 30 and a second outer face 321 of the second cutting face 32 are respectively extended helically around the surface of the bit part 24 and along the bit core 241 toward the shank part 22 to form a first chip-discharge groove 34 and a second flute 36. The radius of the cross section of the bit core 241 is defined as the web thickness.

Figure 3A:
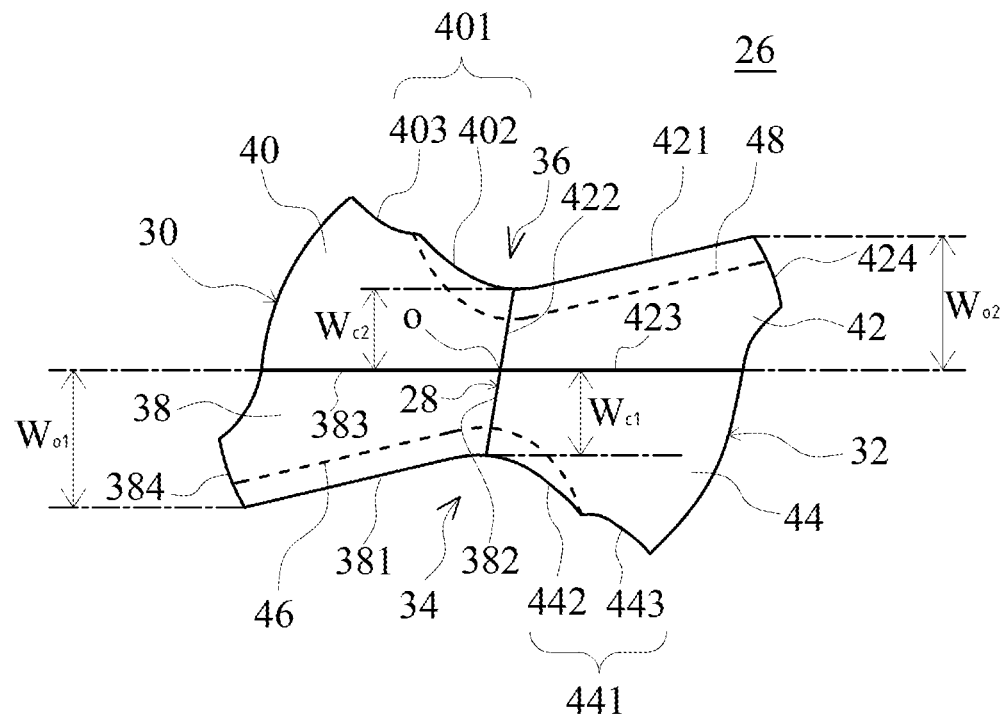
FIG. 3a is a diagram schematically showing the cutting faces of a drill structure according to a first embodiment of the present invention.
Figure 3B:
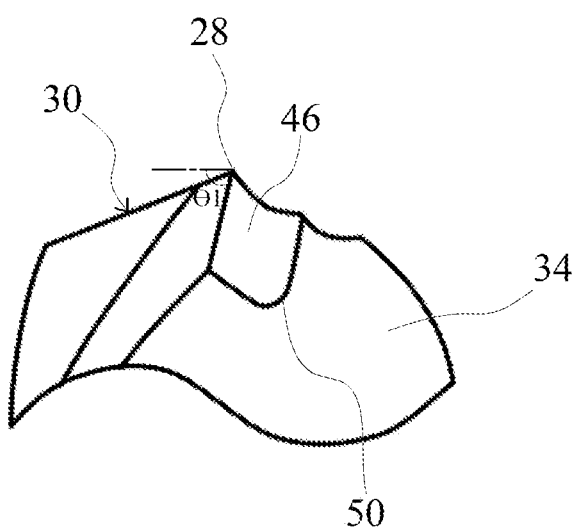
FIG. 3b is a side view schematically showing a portion of the drill bit of the drill structure according to the first embodiment of the present invention.

Refer to FIG. 3a and FIG. 3b. FIG. 3a is a diagram schematically cutting faces of a drill structure according to a first embodiment of the present invention. FIG. 3b is a side view schematically a portion of the bit structure of the drill structure according to the first embodiment of the present invention. As shown in FIG. 3a, the first cutting face 30 includes a first primary cutting face 38 and a first secondary cutting face 40. The second cutting face 32 includes a second primary cutting face 42 and a second secondary cutting face 44. The apexes of the first primary cutting face 38, the first secondary cutting face 40, the second primary cutting face 42 and the second secondary cutting face 44 intersect at a tip O of the web 28. The first primary cutting face 38 has a first cutting edge 381, a first prismatic web edge 382, a first connection edge 383 and a first outer edge 384. The second primary cutting face 42 has a second cutting edge 421, a second prismatic web edge 422, a second connection edge 423 and a second outer edge 424. The first prismatic web edge 382 and the second prismatic web edge 422 jointly form the web 28. The tip O of the web 28 is the intersection point of the first connection edge 383, the second connection edge 423, the first prismatic web edge 382, and the second prismatic web edge 422.

The first connection edge 383 is connected with the first secondary cutting face 40. The first prismatic web edge 382 is connected with the second secondary cutting face 44. The second connection edge 423 is connected with the second secondary cutting face 44. The second prismatic web edge 422 is connected with the first secondary cutting face 40. The first outer edge 384 of the first primary cutting face 38 is connected with one end of the first cutting edge 381 and one end of the first connection edge 383. The shortest distance between two ends of the first outer edge 384 is defined as the outer-side width $W_{o1}$ of the first primary cutting face 38. The second outer edge 424 of the second primary cutting face 42 is connected with one end of the second cutting edge 421 and one end of the second connection edge 423. The shortest distance between two ends of the second outer edge 424 is defined as the outer-side width $W_{o2}$ of the second primary cutting face 42. As shown in FIG. 3a, the first cutting edge 381 of the first primary cutting face 38 is not parallel with the first connection edge 383; the width $W_{c1}$ of the first prismatic web edge 382 is smaller than the outer-side width $W_{o1}$ of the first primary cutting face 38. In other words, the first primary cutting face 38 is gradually widened toward the first outer edge 384. The second cutting edge 421 of the second primary cutting face 42 is not parallel with the second connection edge 423; the width $W_{c2}$ of the second prismatic web edge 422 is smaller than the outer-side width $W_{o2}$ of the second primary cutting face 42. In other words, the second primary cutting face 42 is gradually widened toward the second outer edge 424.

Refer to FIG. 3a again. The first secondary cutting face 40 includes a first blade back 401. The second secondary cutting face 44 includes a second blade back 441. The first cutting edge 381 is smooth connected with the second blade back 441 without any sharp angle therebetween. A first auxiliary cutting face 46 is extended to the wall of the first chip-discharge groove 34 from the first cutting edge 381 and a portion of the second blade back 441 of the second secondary cutting face 44, which is near the first prismatic web edge 382 of the second secondary cutting face 44. The second cutting edge 421 is smooth connected with the first blade back 401 without any sharp angle therebetween. A second auxiliary cutting face 48 is extended to the wall of the second flute 36 from the second cutting edge 421 and a portion of the first blade back 401 of the first secondary cutting face 40, which is near the second prismatic web edge 422. As shown in FIG. 3a and FIG. 3b, each of the first auxiliary cutting face 46 and the second auxiliary cutting face 48 is in form of a groove 50 and tilted to a direction heading for the tip O. FIG. 3b only demonstrates the first auxiliary cutting face 46. The second auxiliary cutting face 48 is symmetrically disposed in the other side with the tip O being the center. An included angle θ1 exists between a horizontal plane and the first auxiliary cutting face 46/the second auxiliary cutting face 48. The included angle θ1 ranges from 0-90 degrees, defining a positive tilt angle of the first auxiliary cutting face 46 and the second auxiliary cutting face 48.

In the first embodiment shown in FIG. 3a and FIG. 3b, each of the first blade back 401 and the second blade back 441 is in form of double arcs. The first blade back 401 includes a first inner arc 402 and a first outer arc 403, which are connected with each other. The first inner arc 402 is connected with one end of the second prismatic web edge 422, which is away from the tip O, and smooth connected with the second cutting edge 421. The second auxiliary cutting face 48 is extended from the first inner arc 402 and the second cutting edge 421 to the wall of the second flute 36. The second blade back 441 includes a second inner arc 442 and a second outer arc 443, which are connected with each other. The second inner arc 442 is connected with one end of the first prismatic web edge 382, which is away from the tip O, and smooth connected with the first cutting edge 381. The first auxiliary cutting face 46 is extended from the second inner arc 442 and the first cutting edge 381 to the wall of the first flute 34.

Figure 4A:
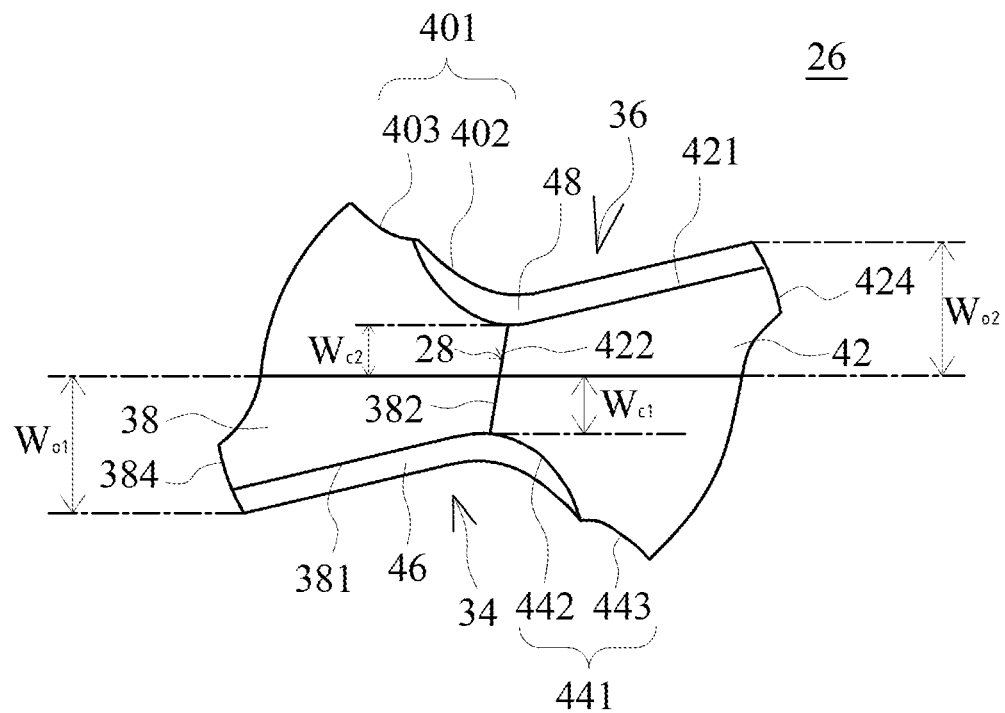
FIG. 4a is a diagram schematically showing the cutting faces of a drill structure according to a second embodiment of the present invention.
Figure 4B:
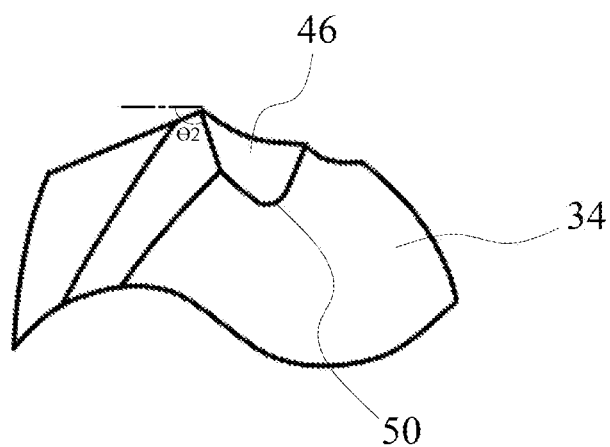
FIG. 4b is a side view schematically showing a portion of the drill bit of the drill structure according to the second embodiment of the present invention.

Refer to FIG. 4a and FIG. 4b. FIG. 4a is a diagram schematically showing the cutting faces of a drill structure according to a second embodiment of the present invention. FIG. 4b is a side view schematically showing a portion of the drill structure according to the second embodiment of the present invention. The second embodiment is different from the first embodiment in that each of the first auxiliary cutting face 46 and the second auxiliary cutting face 48 is tilted to a direction away from the tip O in the second embodiment. Each of the first auxiliary cutting face 46 and the second auxiliary cutting face 48 is also in form of a groove 50 in the second embodiment. FIG. 4b only demonstrates the first auxiliary cutting face 46. The second auxiliary cutting face 48 is symmetrically disposed in the other side with the tip O being the center. An included angle θ2 exists between a horizontal plane and the first auxiliary cutting face 46/the second auxiliary cutting face 48. The included angle θ1 ranges from 90-180 degrees, defining a negative tilt angle of the first auxiliary cutting face 46 and the second auxiliary cutting face 48.

In the second embodiment shown in FIG. 4a and FIG. 4b, each of the first blade back 401 and the second blade back 441 is in form of double arcs. The first blade back 401 includes a first inner arc 402 and a first outer arc 403, which are connected with each other. The first inner arc 402 is connected with one end of the second prismatic web edge 422, which is away from the tip O, and smooth connected with the second cutting edge 421. The second auxiliary cutting face 48 is extended from the first inner arc 402 and the second cutting edge 421 to the wall of the second flute 36. The second blade back 441 includes a second inner arc 442 and a second outer arc 443, which are connected with each other. The second inner arc 442 is connected with one end of the first prismatic web edge 382, which is away from the tip O, and smooth connected with the first cutting edge 381. The first auxiliary cutting face 46 is extended from the second inner arc 442 and the first cutting edge 381 to the wall of the first flute 34.

In the first and second embodiments, the first primary cutting face 38 is gradually widened from the first prismatic web edge 382 toward the first outer edge 384; the second primary cutting face 42 is gradually widened from the second prismatic web edge 422 toward the second outer edge 424. Therefore, each of the outer-side width $W_{o1}$ of the first primary cutting face 38 and the outer-side width $W_{o2}$ of the second primary cutting face 42 is larger than the thickness of the bit core (not shown in the drawing).

The first embodiment and the second embodiment adopt the design that the first cutting edge 381/the second cutting edge 421 is not parallel with the first connection edge 383/the second connection edge 423. Such a design makes the first cutting edge 381 and the second cutting edge 421 have a longer cutting length than the conventional cutting edges. Therefore, the present invention provides a greater cutting force. In the first embodiment and the second embodiment, the width of the first prismatic web edge 382 is smaller than the outer-side width $W_{o1}$ of the first primary cutting face 38; the width of the second prismatic web edge 422 is smaller than the outer-side width $W_{o2}$ of the second primary cutting face 42. Therefore, the web 28, which is formed by the first prismatic web edge 382 and the second prismatic web edge 422, has a smaller thickness. Thus is decreased the drilling resistance and increased the life of the bit part.

Figure 5A:
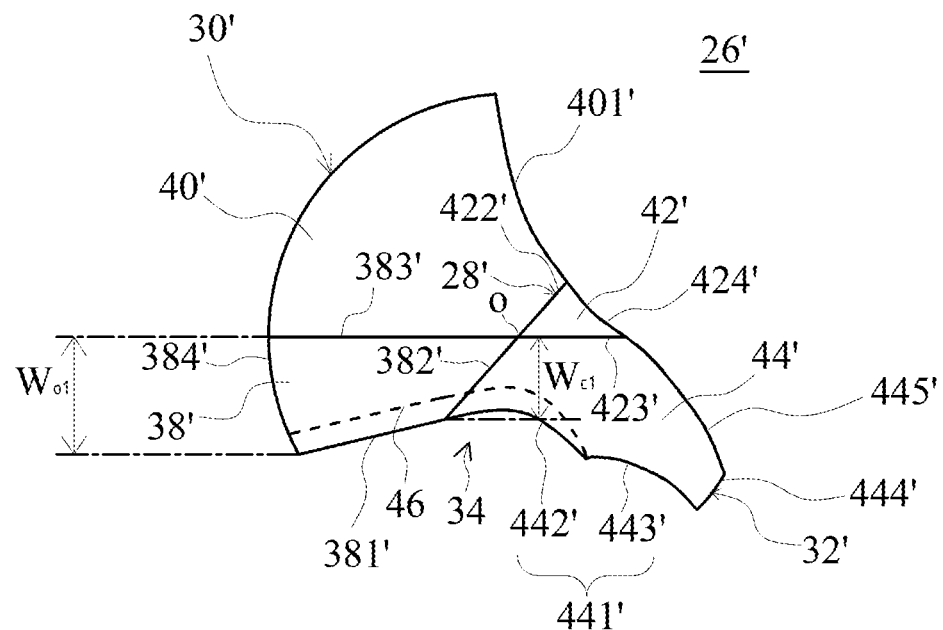
FIG. 5a is a diagram schematically showing the cutting faces of a drill structure according to a third embodiment of the present invention.
Figure 5B:
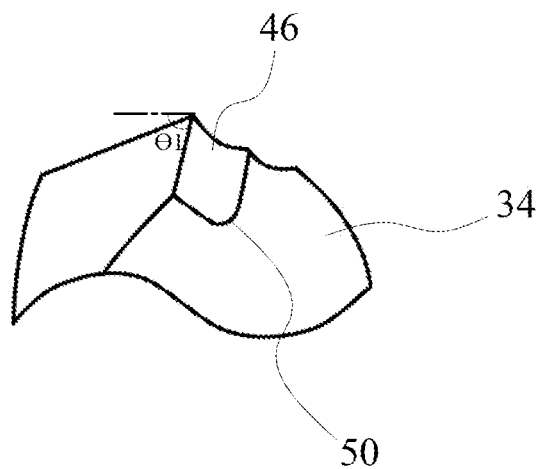
FIG. 5b is a side view schematically showing a portion of the drill bit of the drill structure according to the third embodiment of the present invention.

Refer to FIG. 5a and FIG. 5b. FIG. 5a is a diagram schematically showing the cutting faces of a drill structure according to a third embodiment of the present invention. FIG. 5b is a side view schematically showing a portion of the drill structure according to the third embodiment of the present invention. In the third embodiment, a first cutting face 30' and a second cutting face 32' are respectively formed on two sides of a web 28'. A first outer face of the first cutting face 30' is extended helically around the surface of the bit part 24 toward the shank part 22 (shown in FIG. 2) to form a first chip-discharge groove 34. Different from the first and second embodiments, the drill structure of the third embodiment is a single-groove drill structure, and the first cutting face 30' is asymmetric to the second cutting face 32'.

Refer to FIG. 5a again. In the third embodiment, the first cutting face 30' includes a first primary cutting face 38' and a first secondary cutting face 40'. The first primary cutting face 38' has a first cutting edge 381', a first prismatic web edge 382', a first connection edge 383' and a first outer edge 384'. The shortest distance between two ends of the first outer edge 384' is defined as the outer-side width $W_{o1}$ of the first primary cutting face 38'. The first connection edge 383' is connected with the first secondary cutting face 40'. The first secondary cutting face 40' includes a first blade back 401'. The second cutting face 32' includes a second primary cutting face 42' and a second secondary cutting face 44'. The second primary cutting face 42' is in form of a triangle and includes a second prismatic web edge 422', a second connection edge 423' and a second outer edge 424'. The second connection edge 423' is connected with the second secondary cutting face 44'. The second secondary cutting face 44' includes a second blade back 441', a third outer edge 444', and a fourth outer edge 445'. The first prismatic web edge 382' and the second prismatic web edge 422' form the web 28'. The first prismatic web edge 382' is connected with the second secondary cutting face 44'. The second prismatic web edge 422' is connected with the first secondary cutting face 40'. The first cutting edge 381' of the first primary cutting face 38' is not parallel with the first connection edge 383'. Thus, the width of the first prismatic web edge 382' is smaller than the outer-side width $W_{o1}$ of the first primary cutting face 38'. A first auxiliary cutting face 46 is extended to the wall of the first chip-discharge groove 34 from the first cutting edge 381' and a portion of the second blade back 441' of the second secondary cutting face 44', which is near the first prismatic web edge 382' of the second secondary cutting face 44'.

In the third embodiment, a tip O of the web 28' is the intersection point of the first connection edge 383', the second connection edge 423', the first prismatic web edge 382', and the second prismatic web edge 422'. Refer to FIG. 5b. The first auxiliary cutting face 46 is tilted to a direction heading for the tip O and in form of a groove 50. An included angle θ1 exists between a horizontal plane and the first auxiliary cutting face 46. The included angle θ1 ranges from 0-90 degrees, defining a positive tilt angle of the first auxiliary cutting face 46. In the third embodiment, the second blade back 441' of the second secondary cutting face 44' is in form of double arcs. The second blade back 441' includes a second inner arc 442' and a second outer arc 443', which are connected with each other. The second inner arc 442' is connected with one end of the first prismatic web edge 382', which is away from the tip O, and smooth connected with the first cutting edge 381' without any sharp angle. The first auxiliary cutting face 46 is extended from the second inner arc 442' and the first cutting edge 381' to the wall of the first flute 34.

Figure 6A:
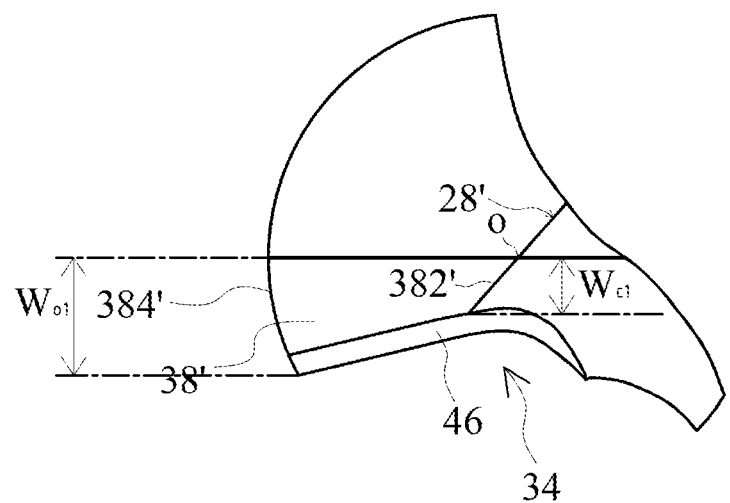
FIG. 6a is a diagram schematically showing the cutting faces of a drill structure according to a fourth embodiment of the present invention.
Figure 6B:
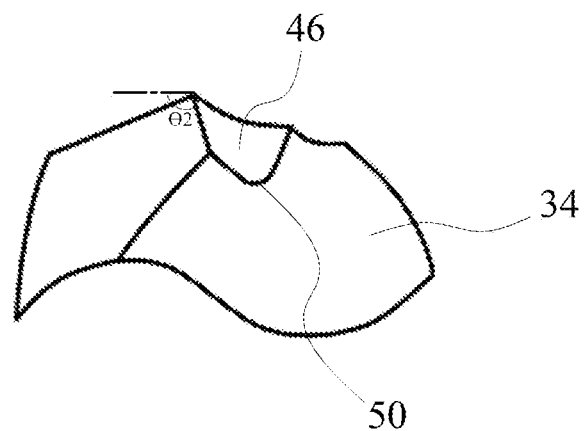
FIG. 6b is a side view schematically showing a portion of the drill bit of the drill structure according to the fourth embodiment of the present invention.

Refer to FIG. 6a and FIG. 6b. FIG. 6a is a diagram schematically showing the cutting faces of a drill structure according to a fourth embodiment of the present invention. FIG. 5b is a side view schematically showing a portion of the drill structure according to the fourth embodiment of the present invention. As shown in FIG. 6a and FIG. 6b, the fourth embodiment is different from the third embodiment in that the first auxiliary cutting face 46 is tilted to a direction away from the tip O in the fourth embodiment. In the fourth embodiment, the first auxiliary cutting face 46 is also in form of a groove 50. In the fourth embodiment, an included angle θ1 exists between a horizontal plane and the first auxiliary cutting face 46. The included angle θ1 ranges from 90-180 degrees, defining a negative tilt angle of the first auxiliary cutting face 46.

In the third and fourth embodiments, the first primary cutting face 38' is gradually widened from the first prismatic web edge 382' toward the first outer edge 384'. Therefore, the width of the first prismatic web edge 382' is smaller than the outer-side width $W_{o1}$ of the first primary cutting face 38'. Then, the web 28' has a smaller thickness. Thus is decreased the drilling resistance and increased the life of the bit part. Besides, the design of the four inclined cutting faces and the inclined auxiliary cutting faces can effectively improve the abrasion resistance of the cutting faces and increase the life of the drill bit.

The embodiments have been described above to demonstrate the technical thought and characteristics of the present invention to enable the persons skilled in the art to understand, make, and use the present invention. However, these embodiments are only to exemplify the present invention but not to limit the scope of the present invention. Any equivalent modification or variation according to the spirit of the present invention is to be also included by the scope of the present invention.

What is claimed is:

1. A drill structure comprising
 a shank part; and
 a bit part disposed on one end of the shank part, having a bit core, which is a cylindrical body along a central axis of the bit part, and having a web at one end of the bit part, which is away from the shank part, wherein two sides of the web are tilted toward the shank part to form a first cutting face and a second cutting face, and wherein a first outer face of the first cutting face is extended helically around a surface of the bit part and along the bit core toward the shank part to form a first flute,
 wherein the first cutting face includes a first primary cutting face and a first secondary cutting face; the first primary cutting face has a first cutting edge, a first prismatic web edge, a first connection edge, and a first outer edge; the shortest distance between two ends of the first outer edge is defined as an outer-side width of the first primary cutting face; the first connection edge is connected with the first secondary cutting face; the first secondary cutting face includes a first blade back;

wherein the second cutting face includes a second primary cutting face and a second secondary cutting face; the second primary cutting face is in form of a triangle; the second primary cutting face has a second prismatic web edge, a second connection edge, and a second outer edge; the second connection edge is connected with the second secondary cutting face; the second secondary cutting face includes a second blade back, a third outer edge, and a fourth outer edge; the first prismatic web edge and the second prismatic web edge jointly form the web; the first prismatic web edge is connected with the second secondary cutting face; the second prismatic web edge is connected with the first secondary cutting face;

wherein the first cutting edge of the first primary cutting face is not parallel with the first connection edge; a width of the first prismatic web edge is smaller than the outer-side width of the first primary cutting face; a first auxiliary cutting face is extended to a wall of a chip-discharge groove from the first cutting edge and a portion of the second blade back, which is near the first prismatic web edge.

2. The drill structure according to claim 1, wherein the web includes a tip; the tip is an intersection point of the first connection edge, the second connection edge, the first prismatic web edge, and the second prismatic web edge; the first auxiliary cutting face is in form of a groove and tilted to a direction heading for or far-away from the tip.

3. The drill structure according to claim 2, wherein each of the first blade back and the second blade back is in form of double arcs; the second blade back includes an inner arc and an outer arc, which are connected with each other; the inner arc is connected with one end of the first prismatic web edge, which is away from the tip; the first auxiliary cutting face is extended from the first cutting edge and the inner arc to the wall of the first flute.

4. The drill structure according to claim 3, wherein the second inner arc of the second secondary cutting face is smoothly connected with the first cutting edge without any sharp angle.

5. The drill structure according to claim 1, wherein the first primary cutting face is gradually widened from the first prismatic web edge toward the first outer edge.

* * * * *